United States Patent
Kim et al.

(10) Patent No.: US 9,588,238 B2
(45) Date of Patent: Mar. 7, 2017

(54) X-RAY DETECTORS

(71) Applicant: Samsung Electronics Co., Ltd., Suwon-Si, Gyeonggi-Do (KR)

(72) Inventors: Young Kim, Yongin-si (KR); Jun-su Lee, Seoul (KR); Sun-il Kim, Osan-si (KR); Jae-chul Park, Suwon-si (KR); Dae-kun Yoon, Daegu (KR); Sang-wook Han, Busan (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 510 days.

(21) Appl. No.: 13/853,166

(22) Filed: Mar. 29, 2013

(65) Prior Publication Data

US 2013/0256545 A1 Oct. 3, 2013

(30) Foreign Application Priority Data

Mar. 30, 2012 (KR) ........................ 10-2012-0033339

(51) Int. Cl.
*G01T 1/24* (2006.01)
*H01L 27/146* (2006.01)

(52) U.S. Cl.
CPC ........ *G01T 1/247* (2013.01); *H01L 27/14636* (2013.01); *H01L 27/14676* (2013.01)

(58) Field of Classification Search
CPC .................................................... G01T 1/247
USPC .................................................... 250/370.09
See application file for complete search history.

(56) References Cited

U.S. PATENT DOCUMENTS

| | | | |
|---|---|---|---|
| 5,164,583 A * | 11/1992 | Aichinger et al. | 250/214 VT |
| 6,208,710 B1 * | 3/2001 | Nagai | 378/108 |
| 6,243,441 B1 * | 6/2001 | Zur | 378/98.8 |
| 6,403,964 B1 | 6/2002 | Kyyhkynen | |
| 6,404,851 B1 * | 6/2002 | Possin et al. | 378/98.7 |
| 6,510,195 B1 | 1/2003 | Chappo et al. | |
| 6,703,617 B1 * | 3/2004 | Spartiotis et al. | 250/370.09 |
| 6,798,453 B1 * | 9/2004 | Kaifu | 348/304 |
| 6,972,411 B2 * | 12/2005 | Schick et al. | 250/370.11 |
| 7,193,219 B2 * | 3/2007 | Schick et al. | 250/370.11 |
| 7,615,754 B2 * | 11/2009 | Liu et al. | 250/370.09 |
| 8,194,823 B2 * | 6/2012 | Ohta et al. | 378/91 |
| 8,265,226 B2 * | 9/2012 | Taoka et al. | 378/98.8 |
| 8,481,956 B2 * | 7/2013 | Boucly et al. | 250/370.09 |
| 8,541,750 B2 * | 9/2013 | Chen et al. | 250/370.11 |
| 8,824,634 B2 * | 9/2014 | Lalena et al. | 378/97 |
| 8,867,705 B2 * | 10/2014 | Lalena et al. | 378/98.5 |
| 8,873,712 B2 * | 10/2014 | Wang et al. | 378/97 |
| 8,953,744 B2 * | 2/2015 | Watanabe et al. | 378/98.8 |
| 2003/0095631 A1 * | 5/2003 | Rosner | 378/98.12 |

(Continued)

FOREIGN PATENT DOCUMENTS

| | | |
|---|---|---|
| JP | 2009-139346 A | 6/2009 |
| JP | 2011-085418 A | 4/2011 |

(Continued)

*Primary Examiner* — David Porta
*Assistant Examiner* — Djura Malevic

(57) ABSTRACT

An X-ray detector may include a silicon substrate including a first area and a second area; a plurality of pixels in the first area configured to detect X-rays; a control pad in the second area configured to supply a common control signal to the plurality of pixels; and/or a power supply pad in the first area configured to supply a power supply voltage to groups of pixels grouped from among the plurality of pixels.

20 Claims, 4 Drawing Sheets

(56) References Cited

U.S. PATENT DOCUMENTS

2006/0164533 A1* 7/2006 Hsieh et al. .................. 348/317
2011/0006191 A1* 1/2011 Watanabe et al. ......... 250/208.1
2011/0309259 A1* 12/2011 Kim et al. ............... 250/370.09
2013/0032696 A1* 2/2013 Tajima ....................... 250/208.1
2013/0161526 A1* 6/2013 Tajima .......................... 250/394

FOREIGN PATENT DOCUMENTS

KR  10-0611169 B1  8/2006
KR  20060130860 A  12/2006

* cited by examiner

X-RAY DETECTORS

CROSS-REFERENCE TO RELATED APPLICATION(S)

This application claims priority from Korean Patent Application No. 10-2012-0033339, filed on Mar. 30, 2012, in the Korean Intellectual Property Office (KIPO), the entire contents of which are incorporated herein by reference.

BACKGROUND

1. Field

Example embodiments may relate to X-ray detectors. Example embodiments also may relate to large-scale X-ray detectors.

2. Description of the Related Art

An X-ray detector using a thin film transistor (TFT) has received attention as an X-ray detector for diagnosing a subject. The X-ray detector outputs an X-ray image or X-ray fluoroscopic image, which is captured by using an X-ray, in the form of digital signals. The X-ray detector includes a direct type and an indirect type.

According to the direct type, a photoconductor directly converts an X-ray into electric charges. In the indirect type, a scintillator converts an X-ray to a visible ray, and then a photoelectric conversion device such as a photodiode converts a converted visible ray into electric charges.

As an area of the X-ray detector is increased, a method of uniformly supplying a power supply voltage to the X-ray detector has been researched. The reason for this is that a voltage drop may occur in an operational state or a standby state of the X-ray detector as a physical size of the X-ray detector is increased.

SUMMARY

Example embodiments may provide X-ray detectors in which power supply voltages are stably supplied.

Example embodiments may provide large-scale X-ray detectors.

In some example embodiments, an X-ray detector may comprise a silicon substrate comprising a first area and a second area; a plurality of pixels in the first area configured to detect X-rays; a control pad in the second area configured to supply a common control signal to the plurality of pixels; and/or a power supply pad in the first area configured to supply a power supply voltage to groups of pixels grouped from among the plurality of pixels.

In some example embodiments, each group of pixels may comprise at least two pixels. A plurality of groups of pixels may be in the first area.

In some example embodiments, the plurality of groups of pixels may be arranged into a n×m matrix form, where n is a natural number that is greater than or equal to 2 and m is a natural number that is greater than or equal to 1.

In some example embodiments, the X-ray detector may further comprise a printed circuit board (PCB) under the silicon substrate. The power supply pad may be connected to the PCB through a conductive via that penetrates the silicon substrate and/or a ball pad between the silicon substrate and the PCB.

In some example embodiments, the second area may be in an edge area of the silicon substrate.

In some example embodiments, some of the plurality of pixels may directly receive the common control signal from the control pad, and/or the rest of the plurality of pixels may sequentially receive the common control signal through a neighboring pixel.

In some example embodiments, each of the plurality of pixels may comprise a photoconductor configured to generate electric charges by using incident X-rays; a charge sensitivity amplifier configured to amplify the electric charges generated from the photoconductor; and/or a comparator configured to compare an output signal of the charge sensitivity amplifier with a first reference voltage and configured to output a result of the comparison.

In some example embodiments, the charge sensitivity amplifier may comprise an amplifier having a first input terminal receiving a second reference voltage; and/or a capacitor of which one end is connected to the photoconductor and a second input terminal of the amplifier and of which another end is connected to the comparator and an output terminal of the amplifier.

In some example embodiments, the first reference voltage may be greater than the second reference voltage.

In some example embodiments, the photoconductor may comprise a single layer covering all of the plurality of pixels.

In some example embodiments, the first area and/or the second area may have tetragonal shapes and/or may be adjacent to each other.

In some example embodiments, the power supply pad may comprise a first power supply pad that supplies a positive voltage and/or a second power supply pad that supplies 0 volts or a negative voltage.

In some example embodiments, an X-ray detector may comprise first and second X-ray detectors each that is formed of the X-ray detector of claim 1. A first area of the first X-ray detector and a first area of the second X-ray detector may be adjacent to each other.

In some example embodiments, a second area of the first X-ray detector and a second area of the second X-ray detector may be spaced apart from each other while interposing the first area of the first X-ray detector and the first area of the second X-ray detector between them.

In some example embodiments, a second area of the first X-ray detector and a second area of the second X-ray detector may be adjacent to each other.

In some example embodiments, the first and/or second areas of the first X-ray detector and the first and/or second areas of the second X-ray detector may have tetragonal shapes.

In some example embodiments, the first and/or second areas of the first X-ray detector or the first and/or second areas of the second X-ray detector may have tetragonal shapes.

In some example embodiments, the second area of the first X-ray detector and/or the second area of the second X-ray detector may have a shape of '⌈' or a shape of '⌊'.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
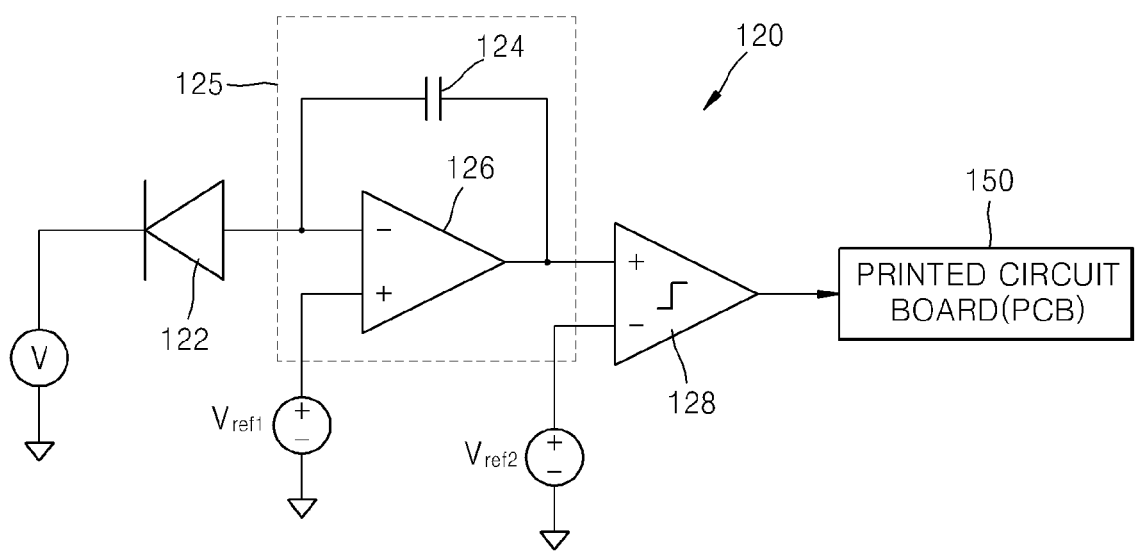
FIG. 1 is a circuit diagram of a pixel of an X-ray detector according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a circuit diagram of a pixel 120 of an X-ray detector according to some example embodiments.

As illustrated in FIG. 1, the pixel 120 may include a photoconductor 122 that generates electric charges (for example, electrons or holes) by using an incident X-ray, a charge sensitivity amplifier 125 that amplifies the electric charges generated in the photoconductor 122, and a comparator 128 that compares an output signal of the charge sensitivity amplifier 125 with a reference voltage and then outputs a result of the comparison.

The size of a control signal that is applied to the photoconductor 122 may vary according to a material and thickness of the photoconductor 122. The photoconductor 122 may be individually formed in an area corresponding to each of a plurality of pixels 120 on a silicon substrate 110 of FIG. 2B or may be formed of a single layer to cover the plurality of pixels 120 on the silicon substrate 110.

The charge sensitivity amplifier 125 may include a capacitor 124 and an amplifier 126. One end of the capacitor 124 is electrically connected to the photoconductor 122 and a first input terminal of the amplifier 126, and the other end of the capacitor 124 is electrically connected to an output terminal of the amplifier 126. The amplifier 126 includes a first input terminal connected to the photoconductor 122, a second input terminal receiving a first reference voltage Vref1, and a first output terminal. The first reference voltage Vref1 may be a ground voltage, i.e., 0 volts. The first input terminal may be a negative terminal of the amplifier 126, and the second input terminal may be a positive terminal of the amplifier 126. In addition, the output terminal of the amplifier 126 may be connected to the other end of the capacitor 124 and the comparator 128. The comparator 128 may include a third input terminal connected to the output of the amplifier 126, a fourth input terminal receiving a second reference voltage Vref2, and a second output terminal. The second reference voltage Vref2 may be higher than the first reference voltage Vref1. The third input terminal may be a positive terminal of the comparator 128, and the fourth input terminal may be a negative terminal of the comparator 128.

In order to detect an X-ray, a control signal for operating the X-ray detector as well as a power supply signal for providing a power supply voltage to the X-ray detector is necessary. Thus, the X-ray detector includes a control pad for supplying the control signal and a power supply pad for supplying the power supply signal, as well as pixels.

Figure 2A:
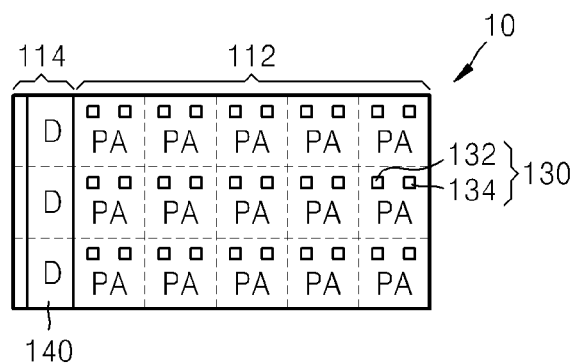
FIG. 2A is a schematic plan view of an X-ray detector according to some example embodiments.
Figure 2B:
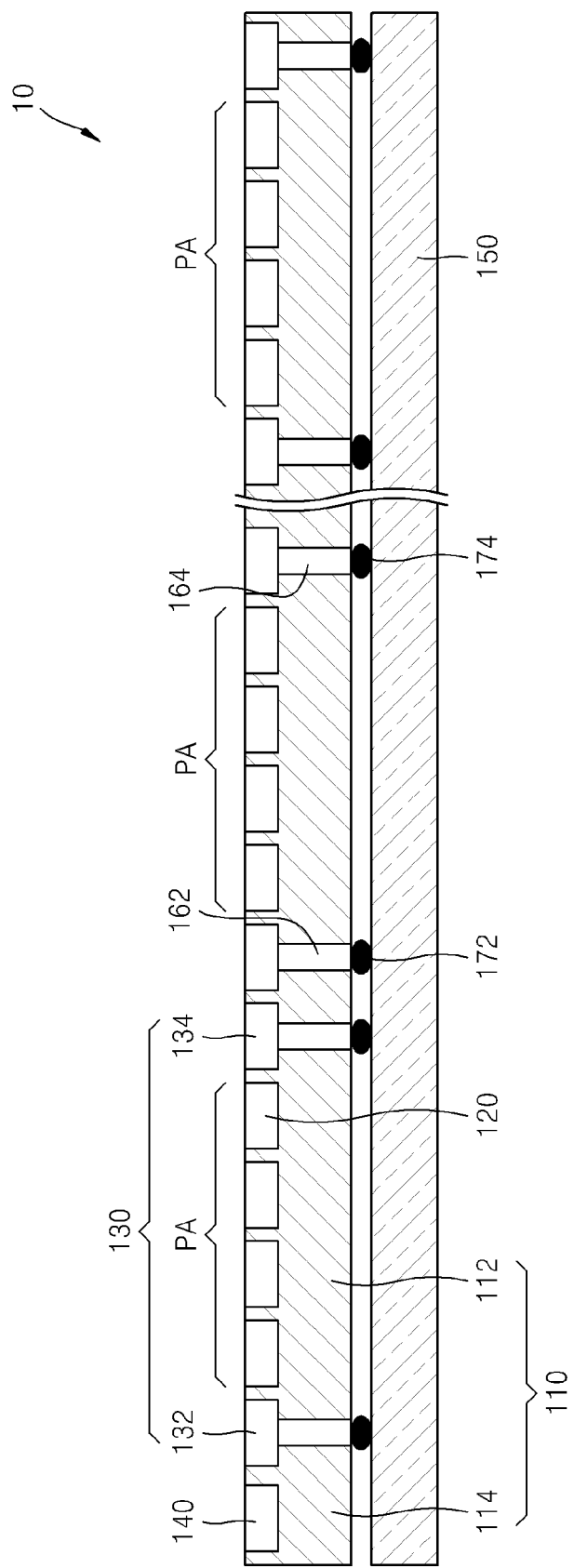
FIG. 2B is a cross-sectional view of the X-ray detector of FIG. 2A.

FIG. 2A is a schematic plan view of an X-ray detector 10 according to some example embodiments, and FIG. 2B is a cross-sectional view of the X-ray detector 10 of FIG. 2A.

Referring to FIGS. 2A and 2B, the X-ray detector 10 may include a silicon substrate 110, a plurality of pixels 120 that detect an X-ray, a power supply pad 130 that supplies a power supply voltage to the plurality of pixels 120, a control pad 140 that supplies a control signal to the plurality of pixels 120, and a printed circuit board (PCB) 150 that quantifies the amount of X-ray transmission through a target object by using signals received from the plurality of pixels 120.

The silicon substrate 110 may be divided into a first area 112 in which the plurality of pixels 120 and the power supply pad 130 are disposed and a second area 114 in which the control pad 140 is disposed. The plurality of pixels 120 may be arranged in a form of m×n matrix (where, m and n are natural numbers that are equal to or greater than 2).

The control pad 140 that supplies a control signal to the plurality of pixels 120 may be disposed in the second area 114 of the silicon substrate 110. The second area 114 may be an edge area of the silicon substrate 110. If the silicon substrate 110 has a tetragonal shape, the second area 114 may be an edge area of the silicon substrate 110, which surrounds the first area 112. However, a portion of the edge area of the silicon substrate 110 may be the second area 114. Thus, the control pad 140 may sequentially supply a control signal to pixels of the same row or column from among the plurality of pixels 120. That is, a pixel adjacent to the control pad 140 may directly receive the control signal from the control pad 140. However, a pixel that is not adjacent to the control pad 140 may receive the control signal through a pixel that is close to the control pad 140 from among neighboring pixels.

A power supply voltage that is applied to the plurality of pixels 120 may be supplied through the control pad 140. However, since the control pad 140 is disposed adjacent to some of the plurality of pixels 120 and pixels that are not adjacent to the control pad receive a signal through another pixel, the power supply voltage may not be well supplied to pixels spaced apart from the control pad 140. Thus, in the X-ray detector 10 according to some example embodiments, the plurality of pixels 120 are grouped into several groups and then a power supply voltage is supplied for each group of pixels. In this case, a group of pixels to which a common power supply voltage is applied is referred to a pixel array PA. The plurality of pixels 120 that are arranged in the form of m×n matrix are grouped in pixel arrays PA each that is arranged in a form of p×q matrix (where, p is a natural number that is equal to or greater than 2, and q is a natural number that is equal to or greater than 1), and the power supply pad 130 is disposed for each pixel array PA.

The power supply pad 130 is disposed in the first area 112 of the silicon substrate 110, and a pair of power supply pads 130 may be disposed per each pixel array PA. The pair of power supply pads 130 may include a first power supply pad 132 that supplies a first voltage, for example, a positive voltage, and a second power supply pad 134 that supplies a second voltage, for example, 0 volts or a negative voltage. At least one pixel of a pixel array may be disposed between the first power supply pad 132 and the second power supply pad 134. Although, in FIG. 2B, four pixels are illustrated between the first power supply pad 132 and the second power supply pad 134, this is just an example and example embodiments are not limited thereto. In addition, the power supply pad 130 may be connected to the PCB 150 through conductive vias 162 and 164, which penetrate the silicon substrate 110, and ball pads 172 and 174 disposed on the PCB 150.

As stated above, since the control pad 140 is formed only in a portion of the edge area of the silicon substrate 110, an X-ray detection area of the X-ray detector may be maximized. In addition, since a power supply voltage is supplied for each pixel array PA, the power supply voltage may be stably supplied to all pixels of the X-ray detector. In addition, a large-scale X-ray detector may be implemented by combining the X-ray detectors 10 according to some example embodiments.

Figure 3:
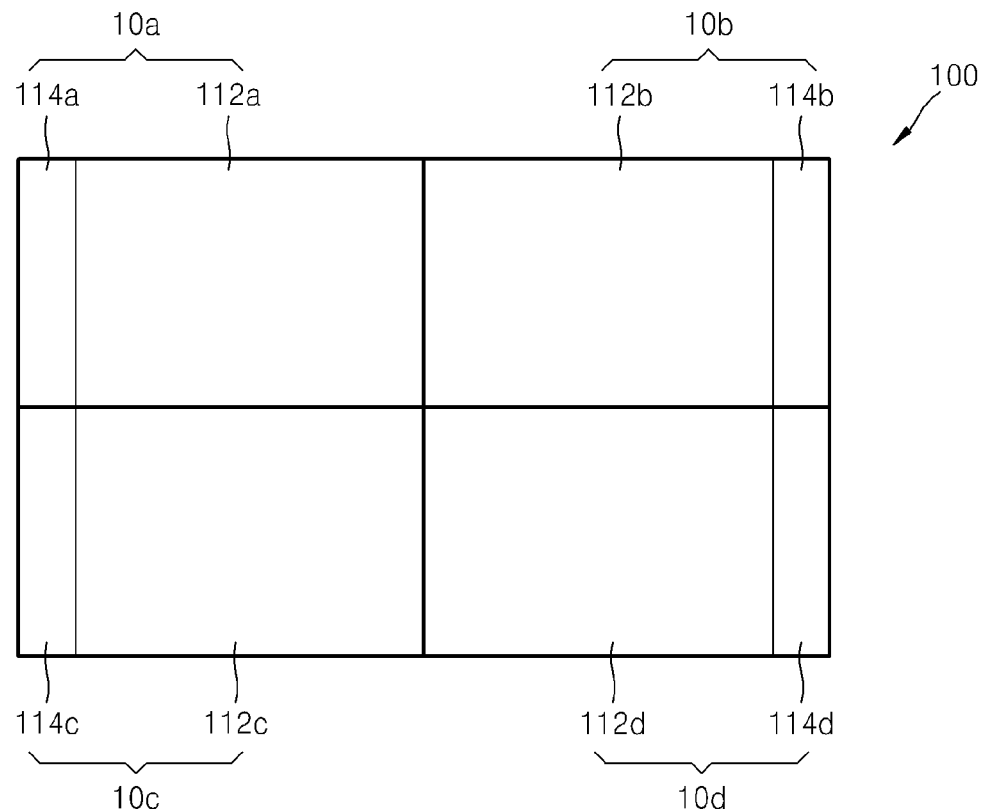
FIG. 3 is a plan view of a large-scale X-ray detector according to some example embodiments.

FIG. 3 is a plan view of a large-scale X-ray detector 100 according to some example embodiments.

As illustrated in FIG. 3, the large-scale X-ray detector 100 may include first through fourth X-ray detectors 10a through 10d. Each of the first through fourth X-ray detectors 10a through 10d may be the same as the X-ray detector 10 illustrated in FIG. 2A. The large-scale X-ray detector 100 may be implemented by arranging the first through fourth X-ray detectors 10a through 10d in a form illustrated in FIG. 3. For example, a first area 112a of the first X-ray detector 10a and a first area 112b of the second X-ray detector 10b may be disposed adjacent to each other, whereas a second area 114a of the first X-ray detector 10a and a second area 114b of the second X-ray detector 10b may be disposed spaced apart from each other while interposing the first areas 112a and 112b between them. The third X-ray detector 10c and the fourth X-ray detector 10d are disposed in the same manner as the first X-ray detector 10a and the second X-ray detector 10b. In addition, the first and second areas 112a and 114a of the first X-ray detector 10a are disposed adjacent to first and second areas 112c and 114c of the third X-ray detector 10c, respectively. The first and second areas 112b and 114b of the second X-ray detector 10b are disposed adjacent to first and second areas 112d and 114d of the fourth X-ray detector 10d, respectively.

Thus, in the large-scale X-ray detector 100, an area including pixels may be disposed in the center area of the large-scale X-ray detector 100, control pads may be disposed in an edge area of the large-scale X-ray detector 100, and thus, an effective area capable of detecting an X-ray may be maximized. In addition, the large-scale X-ray detector 100 illustrated in FIG. 3 may expand an X-ray detection area by using a method of adding the third and fourth X-ray detectors 10c and 10d to the first and second X-ray detectors 10a and 10b.

Figure 4A:
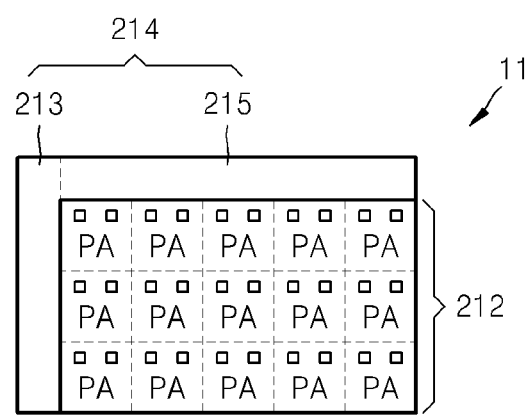
FIGS. 4A and 4B are schematic plan views of X-ray detectors according to some example embodiments.
Figure 4B:
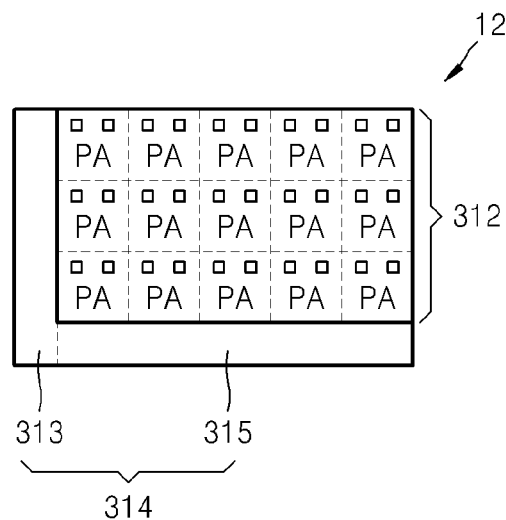

FIGS. 4A and 4B are schematic plan views of X-ray detectors 11 and 12 according to some example embodiments. The X-ray detectors 11 and 12 illustrated in FIGS. 4A and 4B may include a silicon substrate, a plurality of pixels that detect an X-ray, a power supply pad that supplies a power supply voltage to the plurality of pixels, a control pad that supplies a control signal to the plurality of pixels, and a PCB that quantifies the amount of X-ray transmission through a target object by using signals received from the plurality of pixels. The plurality of pixels are disposed in a first area of the silicon substrate 212 and 312, however, in FIG. 4A, a second area 214 of the silicon substrate may have a shape of '┌'. In FIG. 4B, a second area 314 of the silicon substrate may have a shape of '└'. That is, the second area 214 of the X-ray detector 11 may be formed by a combination of a first sub-area 213 that is disposed in a left edge area of the silicon substrate and a second sub-area 215 that is disposed in an upper edge area of the silicon substrate. Then, first and second control pads (not shown) having the same form may be disposed on the first and second sub-areas 213 and 215, respectively. In addition, the second area 314 of the X-ray detector 12 may be formed by a combination of a third sub-area 313 that is disposed in a left edge area of the silicon substrate and a fourth sub-area 315 that is disposed in a lower edge area of the silicon substrate. Then, third and fourth control pads (not shown) having the same form may be disposed on the third and fourth sub-areas 313 and 315, respectively. Thus, one pixel may receive a control signal through two control pads. Thus, defective operation of the X-ray detectors 11 and 12 may be minimized.

Figure 5:
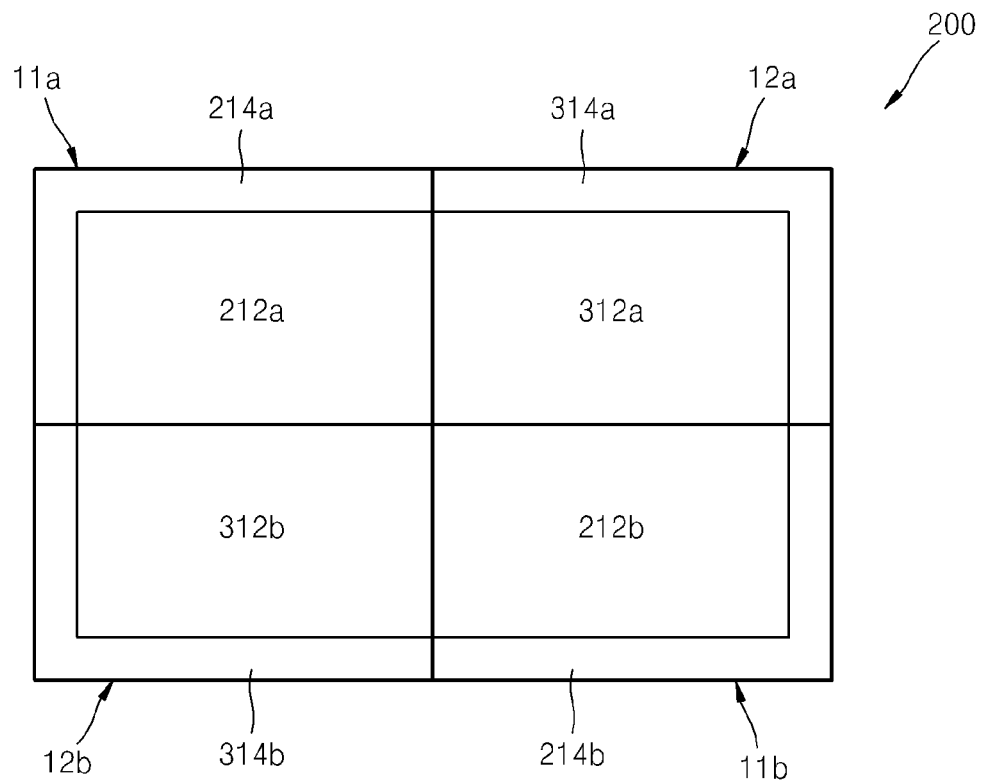
FIG. 5 is a schematic plan view of a large-scale X-ray detector according to some example embodiments.

A large-scale X-ray detector may be implemented by using the X-ray detectors illustrated in FIGS. 4A and 4B. FIG. 5 is a schematic plan view of a large-scale X-ray detector 200 according to some example embodiments.

As illustrated in FIG. 5, the large-scale X-ray detector 200 may include fifth through eighth X-ray detectors 11a, 12a, 12b, and 11b. Each of the fifth and eighth X-ray detectors 11a and 11b may be the same as the X-ray detector 11 illustrated in FIG. 4A, and each of the sixth and seventh X-ray detectors 12a and 12b may be the same as the X-ray detector 12 illustrated in FIG. 4B. A first area 212a of the fifth X-ray detector 11a is disposed adjacent to first areas 312a and 312b of the sixth and seventh X-ray detectors 12a and 12b, and a second area 214a of the fifth X-ray detector 11a is disposed adjacent to second areas 314a and 314b of the sixth and seventh X-ray detectors 12a and 12b. In addition, a first area 212b of the eighth X-ray detector 11b is disposed adjacent to the first areas 312a and 312b of the sixth and seventh X-ray detectors 12a and 12b, and a second area 214b of the eighth X-ray detector 11b is disposed adjacent to the second areas 314a and 314b of the sixth and seventh X-ray detectors 12a and 12b. Thus, the large-scale X-ray detector 200 may be implemented.

The large-scale X-ray detector 200 illustrated in FIG. 5 has a drawback in that it may not be further expanded compared to the large-scale X-ray detector 100 illustrated in FIG. 3, but is useful in that it may be formed to be large-scale compared to the single X-ray detector 10. In addition, a large-scale X-ray detector may be implemented by combining the X-ray detectors illustrated in FIGS. 1A, 4A, and 4B.

An X-ray detector according to the present disclosure may commonly apply a power supply voltage to a plurality of pixels. Thus, the power supply voltage may be stably supplied to the X-ray detector regardless of the number of pixels of the X-ray detector.

Then, since a control pad is disposed only in one side of the X-ray detector, a large-scale X-ray detector having various sizes may be made by combining a plurality of X-ray detectors.

In addition, since the control pad is disposed only in one side of the X-ray detector, an area that does not detect an X-ray may be minimized.

While example embodiments of the inventive concept have been particularly shown and described, it will be understood by those of ordinary skill in the art that various changes in form and details may be made therein without departing from the spirit and scope of the present invention as defined by the following claims.

What is claimed is:

1. An X-ray detector, comprising:
   a plurality of pixels configured to detect X-rays, wherein the pixels are grouped into a plurality of pixel arrays;
   a control pad configured to supply a common control signal to the pixels;
   a plurality of power supply pads, wherein each power supply pad is configured to supply a power supply voltage to a corresponding pixel array; and
   a silicon substrate comprising a first area and a second area, wherein the first area is subdivided into a plurality of sub-areas, wherein each sub-area comprises one of the pixel arrays and the power supply pad corresponding to the pixel array, and wherein the second area comprises the control pad.

2. The X-ray detector of claim 1, wherein the second area comprises an edge area of the silicon substrate that surrounds the first area.

3. The X-ray detector of claim 1, wherein the pixel arrays are arranged into a n×m matrix form, where n is a natural number that is greater than or equal to 2 and m is a natural number that is greater than or equal to 1.

4. The X-ray detector of claim 1, further comprising:
   a printed circuit board (PCB);
   wherein the power supply pads are connected to the PCB through conductive vias that penetrate the silicon substrate and ball pads between the silicon substrate and the PCB.

5. The X-ray detector of claim 1, wherein the second area is in an edge area of the silicon substrate.

6. The X-ray detector of claim 1, wherein some of the plurality of pixels are configured to directly receive the common control signal from the control pad, and a remainder of the plurality of pixels are configured to sequentially receive the common control signal through neighboring pixels.

7. The X-ray detector of claim 1, wherein each of the plurality of pixels comprises:
   a photoconductor configured to generate electric charges by using incident X-rays;
   a charge sensitivity amplifier configured to amplify the electric charges generated from the photoconductor; and
   a comparator configured to compare an output signal of the charge sensitivity amplifier with a first reference voltage and configured to output a result of the comparison.

8. The X-ray detector of claim 7, wherein the charge sensitivity amplifier comprises:
   an amplifier having a first input terminal configured to receive a second reference voltage; and
   a capacitor of which one end is connected to the photoconductor and a second input terminal of the amplifier and of which another end is connected to the comparator and an output terminal of the amplifier.

9. The X-ray detector of claim 8, wherein the first reference voltage is greater than the second reference voltage.

10. The X-ray detector of claim 7, wherein the photoconductor comprises a single layer covering all of the plurality of pixels.

11. The X-ray detector of claim 1, wherein the first area and the second area have tetragonal shapes and are adjacent to each other.

12. The X-ray detector of claim 1, wherein the power supply pads comprise:
   a first power supply pad that supplies a positive voltage; and
   a second power supply pad that supplies 0 volts or a negative voltage.

13. The X-ray detector of claim 1, further comprising:
   a second control pad in the second area configured to supply the common control signal to the plurality of pixels;

wherein a first pixel from the plurality of pixels is configured to receive the common control signal from the control pad and the second control pad.

14. The X-ray detector of claim 1, wherein each pixel in the plurality of pixels comprises a photoconductor.

15. The X-ray detector of claim 1, wherein the X-ray detector is of a direct type.

16. A system, comprising:
a first X-ray detector and a second X-ray detector, each of the X-ray detectors comprising:
 a plurality of pixels configured to detect X-rays, wherein the pixels are grouped into a plurality of pixel arrays;
 a control pad configured to supply a common control signal to the pixels;
 a plurality of power supply pads, wherein each power supply pad is configured to supply a power supply voltage to a corresponding pixel array; and
 a silicon substrate comprising a first area and a second area, wherein the first area is subdivided into a plurality of sub-areas, wherein each sub-area comprises one of the pixel arrays and the power supply pad corresponding to the pixel array, and wherein the second area comprises the control pad;
wherein the first area of the first X-ray detector and the first area of the second X-ray detector are adjacent to each other.

17. The system of claim 16, wherein the second area of the first X-ray detector and the second area of the second X-ray detector are spaced apart from each other while interposing the first area of the first X-ray detector and the first area of the second X-ray detector between them.

18. The system of claim 16, wherein the second area of the first X-ray detector and the second area of the second X-ray detector are adjacent to each other.

19. The system of claim 16, wherein the first and second areas of the first X-ray detector and the first and second areas of the second X-ray detector have tetragonal shapes.

20. The system of claim 16, wherein the second area of the first X-ray detector and the second area of the second X-ray detector have a shape of '┌' or a shape of '└'.

* * * * *